United States Patent
Derakhshan et al.

(10) Patent No.: US 9,535,143 B2
(45) Date of Patent: Jan. 3, 2017

(54) COIL SUPPORT FOR A MAGNETIC RESONANCE IMAGING (MRI) MAGNET AND METHOD OF SUPPORT

(75) Inventors: Mark Derakhshan, Florence, SC (US); Longzhi Jiang, Florence, SC (US); William Einziger, Florence, SC (US); Xiaoxue Diao, Florence, SC (US); Benjamin Gronemeyer, Florence, SC (US); Erman Citirik, Houston, TX (US)

(73) Assignee: General Electric Company, Schenectady, NY (US)

( * ) Notice: Subject to any disclaimer, the term of this patent is extended or adjusted under 35 U.S.C. 154(b) by 857 days.

(21) Appl. No.: 13/169,812

(22) Filed: Jun. 27, 2011

(65) Prior Publication Data

US 2012/0325996 A1     Dec. 27, 2012

(51) Int. Cl.
| | |
|---|---|
| H01F 1/00 | (2006.01) |
| H01F 6/00 | (2006.01) |
| G01R 33/38 | (2006.01) |
| H01F 6/06 | (2006.01) |
| G01R 33/3815 | (2006.01) |

(52) U.S. Cl.
CPC .......... *G01R 33/3802* (2013.01); *H01F 6/06* (2013.01); *G01R 33/3815* (2013.01); *Y10T 29/4984* (2015.01)

(58) Field of Classification Search
USPC ............... 335/216, 299, 300; 336/DIG. 1
See application file for complete search history.

(56) References Cited

U.S. PATENT DOCUMENTS

| | | | | |
|---|---|---|---|---|
| 4,467,303 | A | * | 8/1984 | Laskaris ............... 335/216 |
| RE31,960 | E | | 7/1985 | Phillips |
| 4,658,170 | A | * | 4/1987 | Ueda ................. 310/214 |
| 4,896,128 | A | * | 1/1990 | Wollan et al. ........... 335/299 |
| 5,291,169 | A | | 3/1994 | Ige et al. |
| 5,918,470 | A | * | 7/1999 | Xu et al. .............. 62/51.1 |
| 6,883,226 | B2 | * | 4/2005 | Herndon et al. .......... 29/599 |
| 6,965,236 | B2 | | 11/2005 | Havens |
| 7,013,553 | B2 | * | 3/2006 | Elgin et al. ............. 29/599 |

(Continued)

FOREIGN PATENT DOCUMENTS

| | | |
|---|---|---|
| CN | 101026031 A | 8/2007 |
| CN | 101373654 A | 2/2009 |

(Continued)

OTHER PUBLICATIONS

Search Report from GB Application No. 1211043.3 dated Oct. 4, 2012.

(Continued)

*Primary Examiner* — Terrell McKinnon
*Assistant Examiner* — Michael McDuffie
(74) *Attorney, Agent, or Firm* — Dean D. Small; The Small Patent Law Group, LLC (57) ABSTRACT

A coil support arrangement for a Magnetic Resonance Imaging System and method of support are provided. One coil support arrangement includes a main former body having a plurality of channels between end flanges and a splint coupled to the main former body between the end flanges. The coil support arrangement also includes a load spreader coupled to the main former body adjacent one or more of the ends of the splint, and having a gap between the one or more ends of the splint and the load spreader.

21 Claims, 5 Drawing Sheets

(56) References Cited

U.S. PATENT DOCUMENTS

| | | |
|---|---|---|
| 7,394,338 B2 | 7/2008 | Iwakuma et al. |
| 7,522,027 B2 * | 4/2009 | Calvert et al. ............. 335/299 |
| 7,924,010 B2 | 4/2011 | Jiang et al. |
| 8,780,329 B2 | 7/2014 | Hara et al. |
| 2003/0199005 A1 | 10/2003 | Sabbadini et al. |
| 2006/0238928 A1 | 10/2006 | Iwakuma |
| 2007/0152786 A1 * | 7/2007 | Choi et al. ............. 335/216 |
| 2007/0200654 A1 * | 8/2007 | Yang et al. ............. 335/216 |
| 2007/0247263 A1 | 10/2007 | Calvert et al. |
| 2010/0109824 A1 * | 5/2010 | Wang ............. 335/216 |
| 2010/0244824 A1 * | 9/2010 | Jiang et al. ............. 324/309 |
| 2010/0265018 A1 * | 10/2010 | Kruip et al. ............. 335/216 |

FOREIGN PATENT DOCUMENTS

| | | |
|---|---|---|
| CN | 102097197 A | 6/2011 |
| EP | 0056713 B1 | 8/1985 |
| EP | 0371350 A1 | 6/1990 |
| EP | 1681688 B1 | 10/2008 |
| GB | 2408582 A | 6/2005 |
| GB | 2480637 A | 11/2011 |
| JP | 57142354 A | 9/1982 |
| JP | 2002211608 A | 8/1990 |
| JP | H0335808 B2 | 5/1991 |
| JP | 2006071023 A | 3/2006 |
| JP | 2006196604 A | 7/2006 |
| JP | 2008034525 A | 2/2008 |
| JP | 2009164307 A | 7/2009 |
| JP | 4558517 B2 | 10/2010 |

OTHER PUBLICATIONS

English Translation of the JP OA for Application No. 2012-141542. Office Action dated Feb. 23, 2016.
CN Office Action for Co-Pending Application No. CN 201210214825.4 dated Oct. 27, 2015; 7 pages.

* cited by examiner

COIL SUPPORT FOR A MAGNETIC RESONANCE IMAGING (MRI) MAGNET AND METHOD OF SUPPORT

BACKGROUND OF THE INVENTION

The subject matter disclosed herein relates generally to diagnostic imaging systems, and more particularly to an apparatus for supporting and method for forming a support for a superconducting magnet in a Magnetic Resonance Imaging (MRI) system.

MRI systems and Nuclear Magnetic Resonance (NMR) imaging systems can include a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are sequentially pulsed to create pulsed magnetic gradient fields in a bore of an MRI scanner to selectively excite a volume corresponding to the region of interest in order to acquire MR images of the region of interest. The resultant image that is generated shows the structure and function of the region of interest.

In MRI systems, the superconducting magnet is an electromagnet that is commonly formed from a plurality of superconducting magnetic coils surrounding and supported by a magnet coil support structure. When the superconducting magnetic coils are energized or de-energized, the coils move. The magnet coil support structure maintains the position of the superconducting magnetic coils along and around the support structure.

The magnet coil support structure for MRI systems may be formed as a composite support structure (e.g., a composite former) with channels for receiving and supporting therein the superconducting magnet coils. When the coils are energized or de-energized an electromagnetic (EM) force is applied to the composite support structure. In particular, the EM force compresses the composite support structure in the axial direction to the iso-center of the magnet.

Conventional support structures for resisting the EM forces include a metal, usually stainless steel, splint in the axial direction and extending into and within the magnet coil support structure. The splint supports all of the EM forces. Additionally, the splint adds both weight and cost to the overall system.

BRIEF DESCRIPTION OF THE INVENTION

In accordance with one embodiment, a coil support arrangement for a superconducting magnet is provided. The coil support arrangement includes a main former body having a plurality of channels between end flanges and a splint coupled to the main former body between the end flanges. The coil support arrangement also includes a load spreader coupled to the main former body adjacent one or more of the ends of the splint, and having a gap between the one or more ends of the splint and the load spreader.

In accordance with another embodiment, a coil support arrangement for a superconducting magnet is provided. The coil support arrangement includes a main former body having a plurality of channels between end flanges, with the main former body formed from a non-metal composite material. The coil support arrangement also includes a splint coupled to the main former body axially between the end flanges and above at least some of the plurality of channels, with the splint formed from a metal material. The coil support arrangement further includes a load spreader coupled to the end flanges of the main former body adjacent the ends of the splint, with the load spreader formed from a non-metal composite material, and having a gap between the one or more ends of the splint and the load spreader.

In accordance with yet another embodiment, a method for fabricating a coil support arrangement for a superconducting magnet is provided. The method includes coupling a metal splint to a non-metal main former body between end flanges. The method also includes coupling a non-metal load spreader to the main former body adjacent one or more of the ends of the splint, and having a gap between the one or more ends of the splint and the load spreader.

DETAILED DESCRIPTION OF THE INVENTION

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware or circuitry. Thus, for example, one or more of the blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide an apparatus for supporting and method for forming a support for a magnet in a Magnetic Resonance Imaging (MRI) system. The various embodiments provide a splint arrangement that includes a split with load spreaders. The arrangement allows for the load distribution to be divided differently during different conditions, for example, during ramping operation and normal operation. By practicing various embodiments, structural failure of a main former, particularly in larger pockets or channels is reduced or prevented.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

Figure 1:
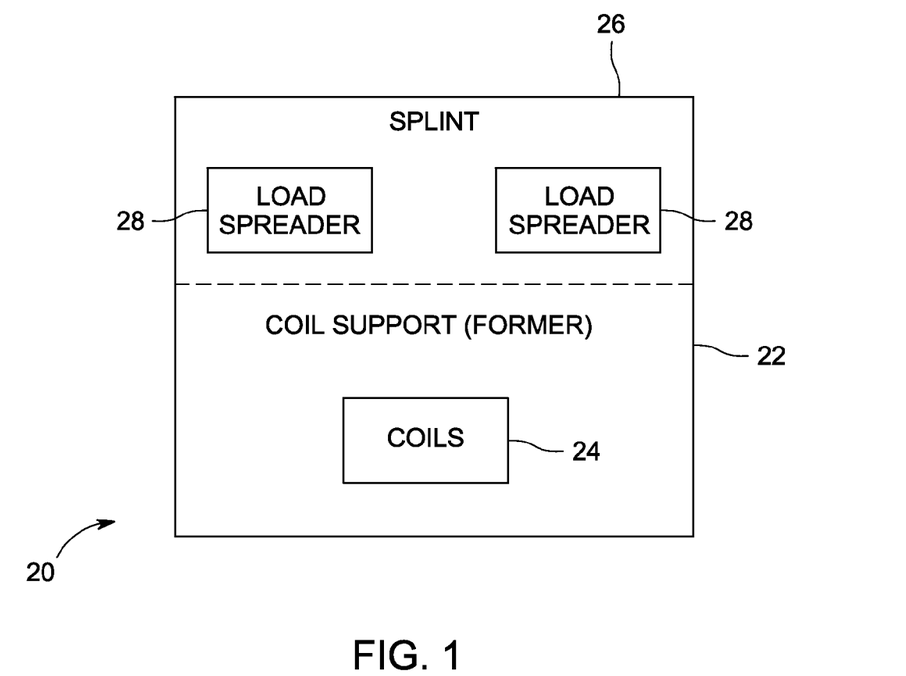
FIG. 1 is a simplified block diagram of a magnet coil support arrangement for a superconducting coil magnet formed in accordance with various embodiments.

As shown in FIG. 1, an MRI magnet coil support arrangement 20 includes a coil support 22, which in various embodiments is a composite former that supports a plurality of coils 24 forming a superconducting magnet. For example, the coil support 22 may be a main former body formed using an epoxy resin composition to form a Fiber Reinforced Plastic (FRP) using methods known in the art. The MRI magnet coil support arrangement 20 also includes a splint 26 in combination with one or more load spreaders 28 (two load spreaders 28 are illustrated). The combination of the splint 26 and the load spreaders 28 are configured to provide support against axial forces, such as electromagnetic (EM) forces (e.g., 3900 kN EM forces) generated by the plurality of coils 24 during certain operating conditions.

The coil support 22 is shaped and sized to support one or more of the plurality of coils 24 of the superconducting magnet. Accordingly, the coil support 22 provides structural support for the one or more coils 24, such as support from axial and radial forces, which are also supported by the splint 26 and load spreaders 28 as described in more detail herein.

Figure 2:
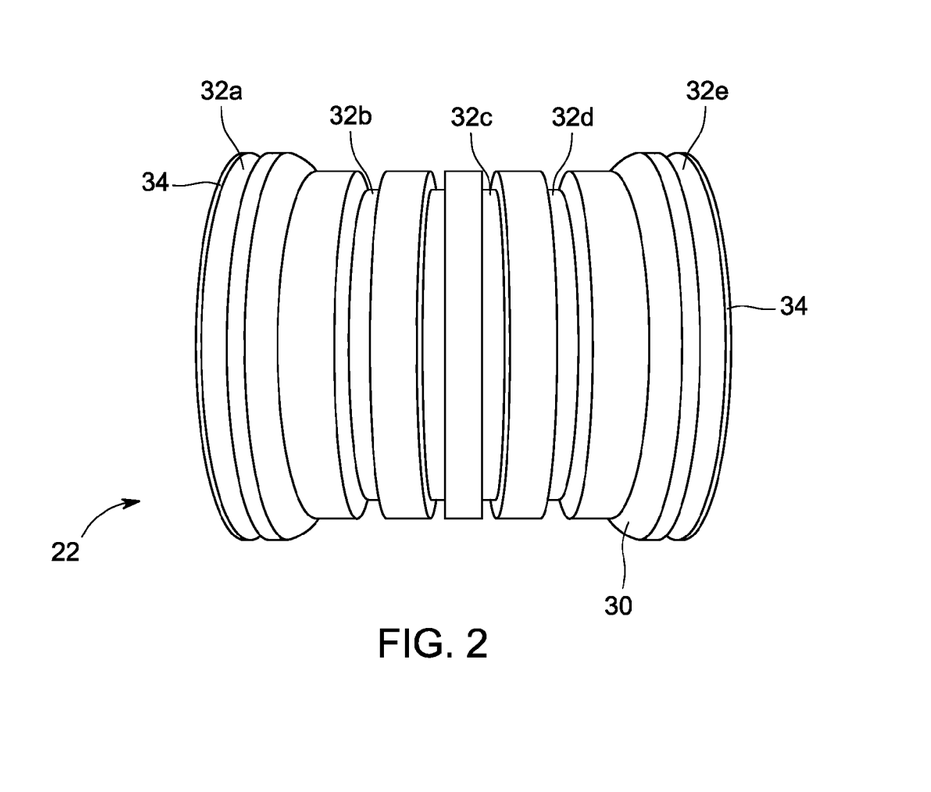
FIG. 2 is a perspective view of a coil support former in accordance with one embodiment.

One embodiment of the coil support 22 is shown in FIG. 2, which is generally cylindrical in shape. The coil support 22 is generally formed from a composite body 30 that includes a plurality of channels 32 that maintain the position of superconducting magnetic coils (not shown) therein. It should be noted that in the illustrated embodiment, the end channels 32a and 32e are larger, for example, circumferentially sized larger than the other channels 32b-d along at least one of the walls that define the channels 32a and 32e. However, the size, including the circumferential size and the width of the channels 32 may be varied as desired or needed.

Figure 3:
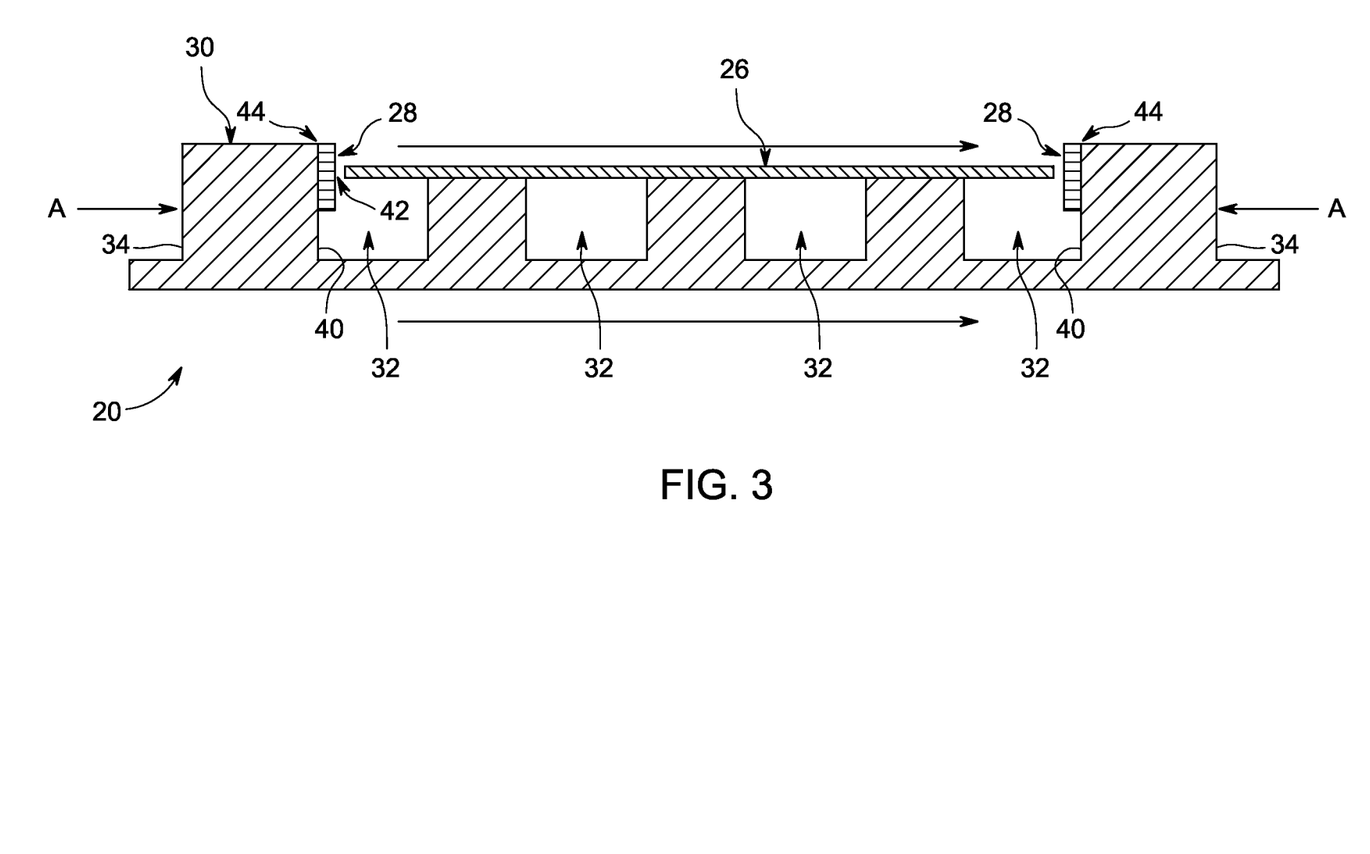
FIG. 3 is a diagram illustrating a Magnetic Resonance Imaging (MRI) magnet coil support arrangement in accordance with various embodiments.

The coil support 22 also includes end flanges 34 that may include the load spreaders 28 (shown in FIG. 1) with the channels 32 therebetween. The load spreaders 28 allow the load from axial forces to be spread or distributed between the splint 26 and the coil support 22 during different operating conditions. For example, in one embodiment, as shown in FIG. 3, axial forces (illustrated by the A arrows) are distributed with coil support arrangement 20. FIG. 3 illustrates a cut-away axis-symmetric view of the coil support.

In this embodiment, the splint 26 may be a metal bar or rod that extends axially between the end flanges 34. For example, the splint 26 may be formed from any suitable metal, such as stainless steel, which in one embodiment, is SS304 stainless steel, or other suitable non-ferrous metal material. The splint 26 may be coupled to a top surface of the composite body 30, for example, above some of the channels 32 using any suitable fastening means (e.g., bolts or other mechanical fastener). The length of the splint 26 is shorter than the distance between the inner walls 40 of the end flanges 34 that also define part of the outermost channels 32. Accordingly, a gap 42 is provided between the ends of the splint 26 and the end flanges 34, and more particularly, between the ends of the splint 26 and the load spreaders 28 that are coupled to the end flanges 34. Accordingly, the load spreaders 28 are positioned adjacent or opposite the ends of the splint 26, but not in contact therewith. It should be noted that the gap 42 may be provided on both ends of the splint 26 or only one end of the splint 26.

In particular, one load spreader 28 is coupled, for example, epoxied or otherwise glued, to an upper end 44 of the inner walls 40 of the end flanges 34. The load spreader 28 may be any structure suitable for transferring a load, in particular an axial force, from the splint 26 to the end flanges 34, and thus, to the composite body 30. In one embodiment, the load spreaders 28 are plates configured to reduce the contact pressure between the splint 26 and the composite body 30 when the composite body 30 compresses under certain conditions (e.g., during normal operating conditions). For example, the load spreaders 28 may be formed from a material similar to the composite body 30. However, the load spreaders 28 may be formed from any suitable composite material, such as a glass-reinforced epoxy laminate, for example, a G10 composite material. The load spreader 28 is sized, particularly in thickness, to allow distribution of the axial forces as well as to provide a predetermined spacing defining the gap 42 between the load spreaders 28 and the splint 26. The load spreaders 28 may extend downward along the inner wall 40, such as about halfway down the inner wall 40. However, the load spreaders 28 may extend more or less as desired or needed, as well as extend circumferentially. Additionally, the load spreaders 28 may take a generally rectangular shape, have a curved upper or bottom end to follow the contour of the composite body 30, or may be shaped as desired or needed.

The gap 42, which is an axial gap 42 between the ends of the splint 26 and the load spreaders 28, in one embodiment, is predetermined to accommodate a coefficient of thermal expansion (CTE) mismatch between the splint 26 formed from metal and the composite body 30 formed from a non-metal. For example, the distance of the gap 42 may be provided such that during a normal operating condition or steady state operation, such as when the magnet temperature reaches 4 degrees Kelvin, the gap 42 is closed such that the ends of the splint 26 abut or contact the load spreaders 28. The contact pressure may vary in different embodiments.

Thus, in operation, during ramping of the magnet (formed by the coils 24 supported on the composite body 30), the gap 42 is not closed, such that the splint 26 absorbs the load. Once the magnet reaches a normal operating condition, such as a 3 Tesla magnetic field, with the splint 26 and the load spreaders 28 in contact, the load distribution is divided between the splint 26 and the composite body 30. For example, in one embodiment, the load distribution is split with twenty five percent of the load on the composite body 30 and seventy five percent of the load on the splint 26. Thus, in various embodiment, the total axial EM force applied on the composite body 30 is distributed or shared between the composite body 30 and the splint 26 during certain conditions, such as during normal operating conditions.

It should be noted that the load spreaders 28 may take different shapes and forms to define different interfaces between the splint 26 and the composite body 30. Thus, the load spreaders 28 may form, for example, different bracket structures for interfacing or receiving the ends of the splint 26. It also should be noted that the load spreaders 28 may be positioned alternatively or additionally at other ones of the channels 32 instead of or in addition to the outermost channels 32 at the end flanges 34. It further should be noted that different configurations of load spreaders may be used together, such as positioned at different locations along the composite body 30.

The different shapes and configuration of the load spreaders described below are merely exemplary. Additionally, the ends of the splint 26 may be shaped or configured complementary to the interface formed by the load spreaders to abuttingly engage the load spreader.

Figure 4:
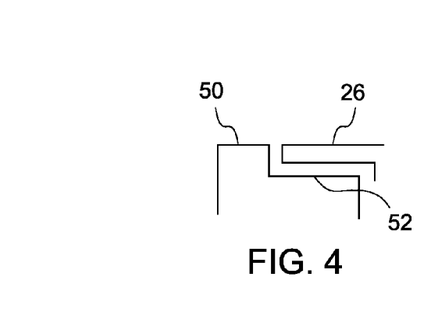
FIG. 4 is a diagram of a load spreader in accordance with one embodiment.
Figure 5:
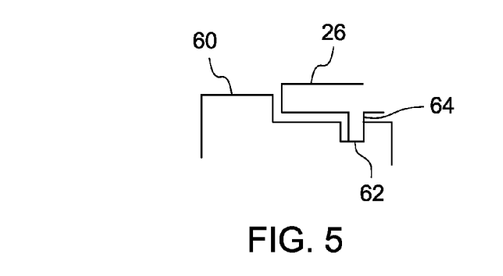
FIG. 5 is a diagram of a load spreader in accordance with another embodiment.
Figure 6:
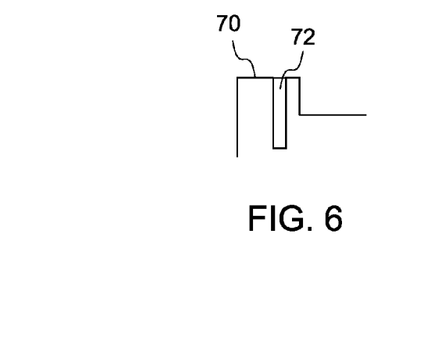
FIG. 6 is a diagram of a load spreader in accordance with another embodiment.

For example, in one embodiment, a load spreader 50 defines a stepwise interface with the splint 26 as shown in FIG. 4. In this embodiment, the load spreader has a single step that defines a shoulder 52 for receiving the end of the splint 26. In another embodiment, as shown in FIG. 5, a load spreader 60 includes, in addition to the stepwise interface, a notch 62 for receiving therein a protrusion 64 of the splint 26. The notch 62 may be sized to allow axial movement of the protrusion 64 therein. In another embodiment, as shown in FIG. 6, the load spreader 70 includes a pin 72 that is configured to engage the splint 26. The pin 72 in various embodiments creates a stress raiser to the thermal contraction.

Figure 7:
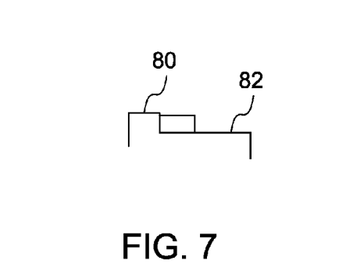
FIG. 7 is a diagram of a load spreader in accordance with another embodiment.
Figure 8:
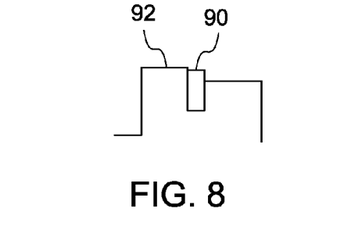
FIG. 8 is a diagram of a load spreader in accordance with another embodiment.

As shown in FIG. 7, the load spreader 80 may have a wider base 82, but with a stepwise interface similar to the load spreader 50 of FIG. 4. In another embodiment, as shown in FIG. 8, a load spreader 90 is provided that includes a ring insert 92 for engaging the splint 26.

Figure 9:
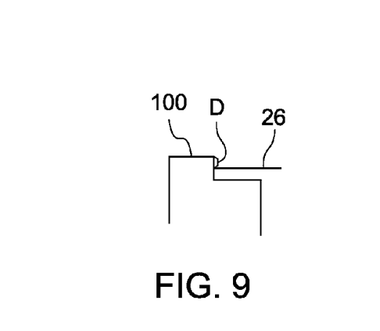
FIG. 9 is a diagram of a load spreader in accordance with another embodiment.

In one embodiment, as shown in FIG. 9, a load spreader 100 is provided with the stepwise interface, but in this embodiment, the step height is greater such that a lower engagement with the splint 26 is provided. Thus, the top of the splint 26 is below the top of the load spreader 100, instead of generally planar with the top as illustrated in the load spreader 50 of FIG. 4.

Figure 10:
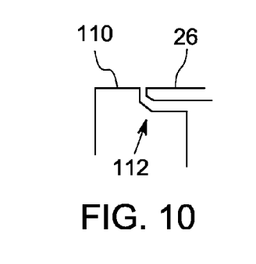
FIG. 10 is a diagram of a load spreader in accordance with another embodiment.

The load spreader may take different cross-sectional shapes. For example, as shown in FIG. 10, a load spreader 110 may be provide having a polygonal shaped step 112, which in the illustrated embodiment include two generally perpendicular walls with an angled middle wall (shown angled at about forty five degrees for illustration). The end of the splint 26 has a complementary shape.

Figures 11, 12:
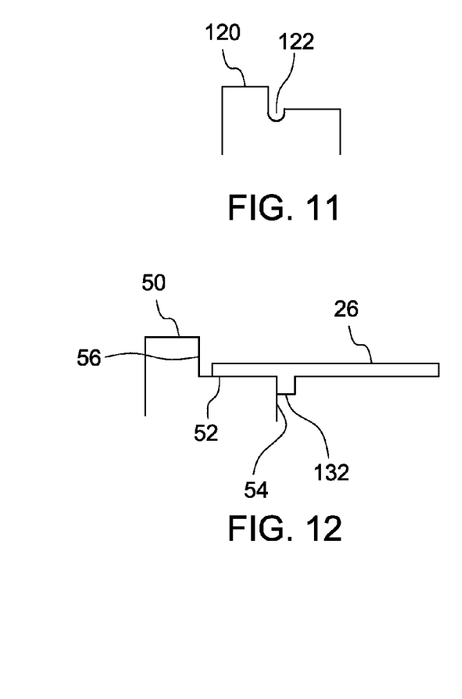
FIG. 11 is a diagram of a load spreader in accordance with another embodiment.
FIG. 12 is a diagram of a splint in accordance with one embodiment.

In another embodiment, a load spreader 120 includes a notch 122 as shown in FIG. 11. However, in contrast to the notch 62 of the load spreader 60 shown in FIG. 5, the notch 122 is curved (instead of rectangular) and is located closer to the end wall of the load spreader 120.

In addition to modifications to the load spreaders, the splint 26 may be modified. For example, the splint 26 may include a protrusion 132 that engages a lower wall 54 of the load spreader 50 as shown in FIG. 12, such that the load spreader 50 is supported by the stepwise interface on the shoulder 52 without contacting the end wall 56 of the load spreader 50.

It should be noted that the above examples are merely for illustration and any shape, configuration or orientation of the splint 26 and load spreaders 28 may be provided.

Thus, various embodiments provide a magnet coil support structure that distributes a load, such as an axial force, for example, between the coil support and the splint using the splint and one or more load spreaders.

Figure 13:
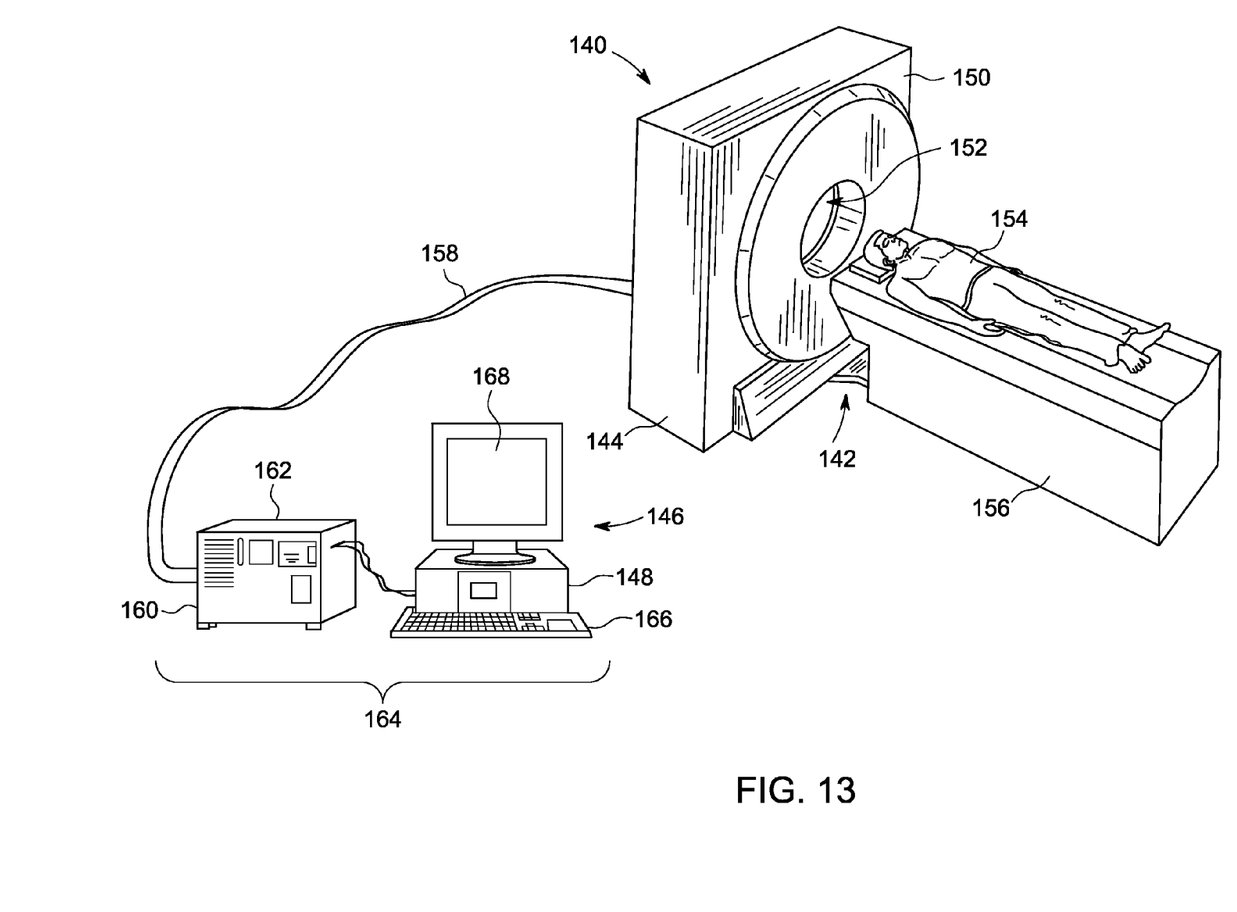
FIG. 13 is a pictorial view of an imaging system in which a magnet coil support arrangement of various embodiments may be implemented.

Various embodiments of the MRI magnet coil support arrangement 20 may be provided as part of an imaging system 140 as shown in FIG. 13. It should be appreciated that although the imaging system 140 is illustrated as a single modality imaging system, the various embodiments may be implemented in or with multi-modality imaging systems. The imaging system 140 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 13, the imaging system 140 includes an imaging portion 142 that having an imaging unit 144 (e.g., imaging scanner) and a processing portion 146 that may include a processor 147 or other computing or controller device. In particular, the imaging unit 144 enables the imaging system 140 to scan an object or patient 155 to acquire image data, which may be image data of all or a portion of the object or patient 155. The imaging unit 144 includes a gantry 150 that includes one or more imaging components (e.g., magnets or magnet windings within the gantry 150) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 146 via a communication link 159 that may be wired or wireless. It should be noted that the signals may be configured in different protocols, etc. It should also be noted that during an imaging scan by the imaging unit 144, the gantry 150 and the imaging components mounted thereon or therein may remain stationary or rotate about or along a center of rotation defining an examination axis through a bore 153. The patient 155 may be positioned within the gantry 150 using, for example, a motorized table 157.

Thus, in operation an output of one or more of the imaging components is transmitted to the processing portion 146, and vice versa, which for example, may include, transmitting signals to or from the processor 147 through a control interface 161. The processor 147 also may generate control signals for controlling the position of the motorized table 157 or imaging components based on, for example, user inputs or a predetermined scan. During a scan, image data, such as magnetic resonance image data from the imaging components may be communicated to the processor 147 through a data interface 163 via the control interface 161. The processor 147 and associated hardware and software used to acquire and process data may be collectively referred to as a workstation 164. The workstation 164 includes a keyboard 167 and/or other input devices such as a mouse, a pointer, and the like, and a display device, illustrated as a monitor 166. The monitor 166 displays image data and may accept input from a user if a touchscreen is available.

Figure 14:
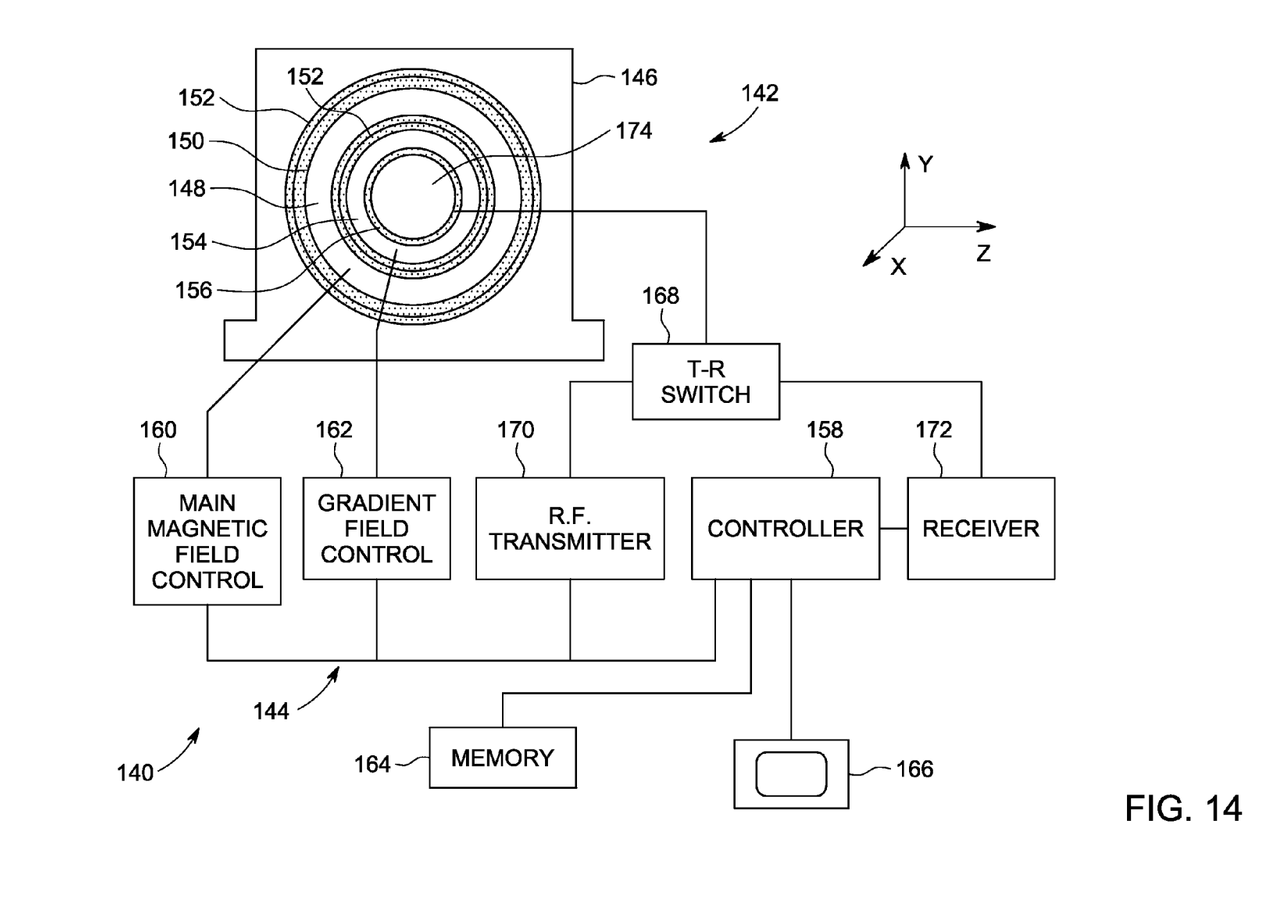
FIG. 14 is a block diagram of an MRI system formed in accordance with various embodiments.

For illustrative purposes only, various embodiments may be implemented as the MRI system 140 as shown in FIG. 14.

In particular, the MRI system 140 generally includes the imaging portion 142 and the processing portion 146 that may include a processor or other computing or controller device. The MRI system 140 includes within a helium vessel 151a superconducting magnet 148 formed from coils, which may be supported on a magnet coil support structure as described herein. The helium vessel 151 surrounds the superconducting magnet 148 and is filled with liquid helium.

Thermal insulation 152 is provided surrounding all or a portion of the outer surface of the helium vessel 151. A plurality of magnetic gradient coils 154 are provided inside the superconducting magnet 148 and an RF transmit coil 156 is provided within the plurality of magnetic gradient coils 154. In some embodiments, the RF transmit coil 156 may be replaced with a transmit and receive coil. The components within the gantry 150 generally form the imaging portion 142. It should be noted that although the superconducting-magnet 148 is a cylindrical shape, other shapes of magnets can be used.

The processing portion 146 generally includes a controller 158, a main magnetic field control 160, a gradient field control 162, a memory 165, a display device, embodied as the monitor 166, a transmit-receive (T-R) switch 168, an RF transmitter 170 and a receiver 172.

In operation, a body of an object, such as a patient or a phantom to be imaged, is placed in a bore 174 on a suitable support, for example, a patient table. The superconducting magnet 148 produces a uniform and static main magnetic field $B_o$ across the bore 174. The strength of the electromagnetic field in the bore 174 and correspondingly in the patient, is controlled by the controller 158 via the main magnetic field control 160, which also controls a supply of energizing current to the superconducting magnet 148.

The magnetic gradient coils 154, which include one or more gradient coil elements, are provided so that a magnetic gradient can be imposed on the magnetic field $B_o$ in the bore 174 within the superconducting magnet 148 in any one or more of three orthogonal directions x, y, and z. The magnetic gradient coils 154 are energized by the gradient field control 162 and are also controlled by the controller 158.

The RF transmit coil 156, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 156.

The RF transmit coil 156 and the receive surface coil are selectably interconnected to one of the RF transmitter 170 or receiver 172, respectively, by the T-R switch 168. The RF transmitter 170 and T-R switch 168 are controlled by the controller 158 such that RF field pulses or signals are generated by the RF transmitter 170 and selectively applied to the patient for excitation of magnetic resonance in the patient. While the RF excitation pulses are being applied to the patient, the T-R switch 168 is also actuated to disconnect the receive surface coil from the receiver 172.

Following application of the RF pulses, the T-R switch 168 is again actuated to disconnect the RF transmit coil 156 from the RF transmitter 170 and to connect the receive surface coil to the receiver 172. The receive surface coil operates to detect or sense the MR signals resulting from the excited nuclei in the patient and communicates the MR signals to the receiver 172. These detected MR signals are in turn communicated to the controller 158. The controller 158 includes a processor (e.g., image reconstruction processor), for example, that controls the processing of the MR signals to produce signals representative of an image of the patient.

The processed signals representative of the image are also transmitted to the monitor 166 to provide a visual display of the image. Specifically, the MR signals fill or form a k-space that is Fourier transformed to obtain a viewable image. The processed signals representative of the image are then transmitted to the monitor 166.

The various embodiments and/or components, for example, the modules, or components and controllers therein, such as of the MRI system 140, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" may include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A coil support arrangement for a superconducting magnet, the coil support arrangement comprising:
   a main former body having a plurality of channels between end flanges;
   a splint coupled to the main former body between the end flanges; and
   a load spreader coupled to the main former body adjacent one or more of the ends of the splint, and having a gap between the one or more ends of the splint and the load spreader.

2. The coil support arrangement of claim 1, wherein the main former body is formed from a composite material, the splint is formed from a metal material and the load spreader is formed from a composite material.

3. The coil support arrangement of claim 2, wherein the main former body is formed from a different composite material than the load spreader.

4. The coil support arrangement of claim 2, wherein the main former body is formed from a same composite material than the load spreader.

5. The coil support arrangement of claim 2, wherein the splint is formed from stainless steel and the load spreader is formed from an epoxy laminate.

6. The coil support arrangement of claim 1, wherein the gap is sized such that during normal operation of the superconducting magnet, the ends of the splint abut the load spreaders.

7. The coil support arrangement of claim 1, wherein the load spreader comprises a plate.

8. The coil support arrangement of claim 1, wherein the load spreader is configured as a stepwise interface.

9. The coil support arrangement of claim 1, wherein the load spreader is configured having a polygonal shaped interface.

10. The coil support arrangement of claim 1, wherein the load spreader is coupled to an inner wall of the end flange of the main former body.

11. The coil support arrangement of claim 1, wherein the load spreader is coupled to one of a plurality of inner channels of the main former body.

12. A coil support arrangement for a superconducting magnet, the coil support arrangement comprising:
    a main former body having a plurality of channels between end flanges, the main former body formed from a non-metal composite material;
    a splint coupled to the main former body axially between the end flanges and above at least some of the plurality of channels, the splint formed from a metal material; and
    a load spreader coupled to the end flanges of the main former body adjacent the ends of the splint, the load spreader formed from a non-metal composite material, and having a gap between the one or more ends of the splint and the load spreader.

13. The coil support arrangement of claim 12, wherein the non-metal composite material forming the main former body and the load spreader is the same.

14. The coil support arrangement of claim 12, wherein the non-metal composite material forming the main former body and the load spreader is different.

15. The coil support arrangement of claim 12, wherein the gap is sized such that during normal operation of the superconducting magnet at about 4 degrees Kelvin, the ends of the splint abut the load spreaders.

16. The coil support arrangement of claim 12, wherein the ends of the splint and the load spreaders are complementary shaped or configured.

17. The coil support arrangement of claim 12, further comprising load spreaders coupled between the end flanges of the main former body.

18. A method for fabricating a coil support arrangement for a superconducting magnet, the method comprising:
coupling a metal splint to a non-metal main former body between end flanges; and
coupling a non-metal load spreader to the main former body adjacent one or more of the ends of the splint, and having a gap between the one or more ends of the splint and the load spreader.

19. The coil support arrangement of claim 1, wherein the gap is sized such that during ramping operation of the superconducting magnet, a space is provided between the one or more ends of the splint and the load spreader, and during normal operation of the superconducting magnet, the one or more ends of the splint abut the load spreader closing the gap.

20. The coil support arrangement of claim 1, wherein the one or more ends of the splint are defined by an edge having a side surface facing the load spreader, the side surface between top and bottom surfaces of the splint, and wherein the gap is between the side surface of the edge of the one or more ends of the splint and the load spreader.

21. The coil support arrangement of claim 1, wherein the one or more ends of the splint are aligned axially with the load spreader to define a support axis, the gap between the one or more ends of the splint and the load spreader being along the support axis.

* * * * *